US009070637B2

United States Patent
Yoda et al.

(10) Patent No.: US 9,070,637 B2
(45) Date of Patent: Jun. 30, 2015

(54) DEVICE-MOUNTED SUBSTRATE, INFRARED LIGHT SENSOR AND THROUGH ELECTRODE FORMING METHOD

(75) Inventors: Tsuyoshi Yoda, Matsumoto (JP); Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 74 days.

(21) Appl. No.: 13/412,951

(22) Filed: Mar. 6, 2012

(65) Prior Publication Data

US 2012/0235261 A1    Sep. 20, 2012

(30) Foreign Application Priority Data

Mar. 17, 2011  (JP) ................................. 2011-059798

(51) Int. Cl.

| | | |
|---|---|---|
| H01L 29/40 | (2006.01) | |
| H01L 31/115 | (2006.01) | |
| H01L 21/44 | (2006.01) | |
| H01L 23/31 | (2006.01) | |
| H01L 31/0224 | (2006.01) | |
| H01L 21/768 | (2006.01) | |
| H01L 27/146 | (2006.01) | |

(52) U.S. Cl.

CPC .... *H01L 23/3114* (2013.01); *H01L 31/022408* (2013.01); *H01L 21/76898* (2013.01); *H01L 27/14636* (2013.01); *H01L 27/14649* (2013.01); *H01L 27/14692* (2013.01); *H01L 2924/0002* (2013.01)

(58) Field of Classification Search

CPC .............. H01L 23/3114; H01L 23/481; H01L 31/022408; H01L 21/76898

USPC ........................... 257/774, E23.011; 438/675

See application file for complete search history.

(56) References Cited

U.S. PATENT DOCUMENTS

| 6,664,640 | B2 | 12/2003 | Kohno | |
|---|---|---|---|---|
| 2007/0166957 | A1* | 7/2007 | Kameyama et al. | 438/459 |
| 2008/0023846 | A1* | 1/2008 | Seki et al. | 257/774 |
| 2008/0284041 | A1* | 11/2008 | Jang et al. | 257/774 |
| 2009/0305502 | A1* | 12/2009 | Lee et al. | 438/667 |
| 2011/0237027 | A1* | 9/2011 | Kim et al. | 438/107 |
| 2011/0318923 | A1* | 12/2011 | Park et al. | 438/675 |
| 2012/0068313 | A1* | 3/2012 | Pagaila et al. | 257/621 |
| 2012/0074582 | A1* | 3/2012 | Yu et al. | 257/774 |
| 2012/0074584 | A1* | 3/2012 | Lee et al. | 257/774 |
| 2012/0153492 | A1* | 6/2012 | Bachman et al. | 257/774 |

FOREIGN PATENT DOCUMENTS

| JP | 2002-190477 | 7/2002 |
|---|---|---|
| JP | 2003-045875 | 2/2003 |
| JP | 2005-243689 A | 9/2005 |
| JP | 2007-073775 | 3/2007 |
| JP | 2008-270354 A | 11/2008 |
| JP | 2010-114352 A | 5/2010 |

(Continued)

*Primary Examiner* — Chuong A Luu
*Assistant Examiner* — Moazzam Hossain
(74) *Attorney, Agent, or Firm* — Harness, Dickey & Pierce, P.L.C.

(57) ABSTRACT

A via hole is formed on a base substrate before a device circuit is formed, and thermal oxidation is performed to form a thermal oxidation layer on a surface of the base substrate on which the device circuit is formed and a surface in the via hole. The device circuit having a conductive section is formed on the base substrate after the thermal oxidation, and then, a conductive body is embedded in the via hole.

20 Claims, 6 Drawing Sheets

(56) References Cited

FOREIGN PATENT DOCUMENTS

| JP | 2010-129952 | 6/2010 |
| JP | 2010-177237 | 8/2010 |
| JP | 2010-205990 | 9/2010 |
| WO | WO-2005-101476 A1 | 10/2005 |
| WO | WO-2010-017162 A1 | 2/2010 |

\* cited by examiner

DEVICE-MOUNTED SUBSTRATE, INFRARED LIGHT SENSOR AND THROUGH ELECTRODE FORMING METHOD

BACKGROUND

The entire disclosure of Japanese Patent Application No. 2011-059798, filed Mar. 17, 2011, is expressly incorporated by reference herein.

1. Technical Field

The present invention relates to a device-mounted substrate including a through electrode, an infrared light sensor and a through electrode forming method.

2. Related Art

In a three-dimensional mounting package, a plurality of chips (device-mounted substrates) is vertically stacked to become one package, to thereby make it possible to reduce an occupation area. Thus, by using a through electrode which uses a via hole which is vertically formed through chips such as silicon wafers or dies, the wafers or dies are electrically connected with each other in the vertical direction.

Such a chip including the through electrode includes a semiconductor substrate and the through electrode formed in the semiconductor substrate. In the chip, since the semiconductor substrate has a specific electric potential with respect to a circuit formed on the semiconductor substrate and has an electric potential difference with respect to the through electrode which is electrically conductive with the circuit, a leakage current may occur between the through electrode and the semiconductor substrate. Thus, in JP-A-2010-177237, in order to prevent a leakage current, a resin insulating layer is formed between a through electrode and a substrate, and between an electrode connected with the through electrode and the substrate.

However, in a case where fine through electrodes of a high aspect ratio are formed by using the resin insulating layer, it is difficult to form the resin insulating layer with a sufficient thickness, thereby lowering the insulation function of the resin insulating layer.

SUMMARY

An advantage of some aspects of the invention is to provide a device-mounted substrate including fine through electrodes of a high aspect ratio which include an insulating film having superior insulation characteristics, an infrared light sensor having the device-mounted substrate and a through electrode forming method.

Application Example 1

This application example is directed to a device-mounted substrate including: a base substrate having a first surface and a second surface opposite to each other; a via hole formed in the base substrate, the via hole being open at the first and second surfaces, the via hole having an internal surface in the base substrate; a first insulating layer including a thermal oxidation layer, the thermal oxidation layer being formed on the first surface and the internal surface; a conductive body being disposed in the via hole, the conductive body being surrounded by the first insulating layer; a wiring layer being electrically connected to the conductive body, the wiring layer being disposed above the first surface through the first insulating layer; and a device circuit which is electrically connected with the wiring layer, wherein a first thickness of the first insulating layer disposed on the first surface and a second thickness of the first insulating layer disposed on the internal surface are the same.

With this configuration, it is possible to form an insulating film which is fine and has a uniform thickness on one surface (first surface) of the base substrate and the internal surface in the via hole by thermal oxidation. Further, it is possible to obtain a device-mounted substrate having superior insulation characteristics in a corner portion (via corner portion) in which one surface of the base substrate and the internal surface in the via hole are formed and a leakage current easily occurs.

Application Example 2

This application example is directed to the device-mounted substrate according to Application Example 1, which further includes: a second insulating layer being connected with the first insulating layer, and the second insulating layer being disposed on the second surface of the base substrate.

With this configuration, it is possible to enhance insulation characteristics in the corner portion in which other surface (second surface) of the base substrate and the internal surface in the via hole are formed.

Application Example 3

This application example is directed to the device-mounted substrate according to Application Example 1 or 2, wherein the conductive body includes a protruding section which protrudes from the second surface of the base substrate.

With this configuration, it is possible to vertically stack the device-mounted substrates, and to easily manufacture a three-dimensional stacked package.

Application Example 4

This application example is directed to a through electrode forming method including: forming a via hole from a first surface of a base substrate, the via hole having an internal surface in the base substrate; forming a thermal oxidation layer on the first surface of the base substrate and the internal surface of the via hole by thermal oxidation; forming a device circuit which includes a conductive section above the first surface of the base substrate through the thermal oxidation layer; and embedding a conductive body in the via hole, after the forming of the device circuit.

With this configuration, it is possible to form fine through electrodes of a high aspect ratio which include an insulating film having superior insulation characteristics, without causing a migration problem.

Application Example 5

This application example is directed to the method according to Application Example 4, which further includes: embedding a temporary embedded material in the via hole, between the forming of the thermal oxidation layer and the forming of the device circuit; and removing the temporary embedded material, between the forming of the device circuit and the embedding of the conductive body.

With this configuration, even though the via hole is formed in advance, as gas remaining in the cavity portion of the via hole is expanded in forming the device, it is possible to effectively prevent an adhesive force of the device circuit to the base substrate from being reduced.

Application Example 6

This application example is directed to the method according to Application Example 4 or 5, which further includes: grinding a second surface of the base substrate, the second surface being opposite to the first surface through the base substrate; and disposing an insulating layer which is continuous with the thermal oxidation layer on the second surface of the base substrate, between the forming of the device circuit and the embedding of the conductive body.

With this configuration, it is possible to effectively suppress a leakage current from occurring in the corner portion in which the other surface of the base substrate and the internal surface in the via hole are formed.

Application Example 7

This application example is directed to the method according to Application Example 6, which further includes: forming a terminal which is electrically connected with the conductive body on the second surface of the base substrate, after the embedding of the conductive body.

With this configuration, it is possible to perform an external connection on the other surface of the base substrate.

Application Example 8

This application example is directed to the method according to Application Example 7, which further includes: attaching a supporting member to the first surface of the base substrate, before grinding the second surface of the base substrate.

With this configuration, it is possible to secure processability of the base substrate which is a thin plate.

Application Example 9

This application example is directed to the method according to Application Example 8, which further includes: removing the supporting member attached to the first surface of the base substrate, after forming the terminal.

With this configuration, it is possible to prevent a supporting substrate from moving to the subsequent process.

Application Example 10

This application example is directed to the method according to Application Example 4, wherein the via hole is formed through the base substrate as a through hole.

With this configuration, even though the via hole is formed in advance, gas does not remain in the cavity portion, and thus, it is not necessary to use the temporary embedded material, which results in shortening the process.

Application Example 1

This application example is directed to the method according to any one of Application Examples 4 to 10, wherein the conductive body is formed by plating.

With this configuration, it is possible to easily embed the conductive body in fine via holes of a high aspect ratio, and thus, it is not necessary to use an expensive device such as a CVD.

Application Example 12

This application example is directed to an infrared light sensor including: a base substrate having a first surface and a second surface opposite to each other; a via hole formed in the base substrate, the via hole being open at the first and second surfaces, the via hole having an internal surface in the base substrate; a first insulating layer including a thermal oxidation layer, the thermal oxidation layer being formed on the first surface and the internal surface; a conductive body being disposed in the via hole, the conductive body being surrounded by the first insulating layer; a wiring layer being electrically connected to the conductive body, the wiring layer being disposed above the first surface through the first insulating layer; and an infrared light detection device being electrically connected to the wiring layer, wherein a first thickness of the first insulating layer disposed on the first surface and a second thickness of the first insulating layer disposed on the internal surface are the same.

With this configuration, it is possible to form an insulating film which is fine and has a uniform thickness on one surface of the base substrate and the internal surface in the via hole by thermal oxidation. Further, it is possible to obtain a device-mounted substrate having superior insulation characteristics in a corner portion (via corner portion) in which one surface of the base substrate and the internal surface in the via hole are formed and a leakage current easily occurs. Further, it is possible to form fine through electrodes of a high aspect ratio, and thus, it is possible to install infrared light sensors with high density.

According to the configurations of the invention, since the formation of the via hole and the insulating layer which form the through electrode and the formation of the embedded electrode which includes the conductive body are performed in the divided processes before and after formation of the device circuit, it is possible to easily manufacture a device circuit-mounted substrate structure which has a fine through electrode structure which has a high aspect ratio and multiple via holes. Specifically, it is possible to form a thermal oxidation insulating film which has superior insulation characteristics in fine through electrodes of a high aspect ratio before formation of the device circuit, and to embed the conductive body by plating after formation of the device circuit without causing a migration problem, thereby making it possible to use a simple apparatus or method.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, specific embodiments of a device-mounted substrate, an infrared light sensor and a through electrode forming method according to the invention will be described in detail with reference to the accompanying drawings.

The embodiments are only examples, and a variety of modified configurations may be adopted in a range without departing from the main spirit of the invention.

Configuration of Device-Mounted Substrate

Figure 1:
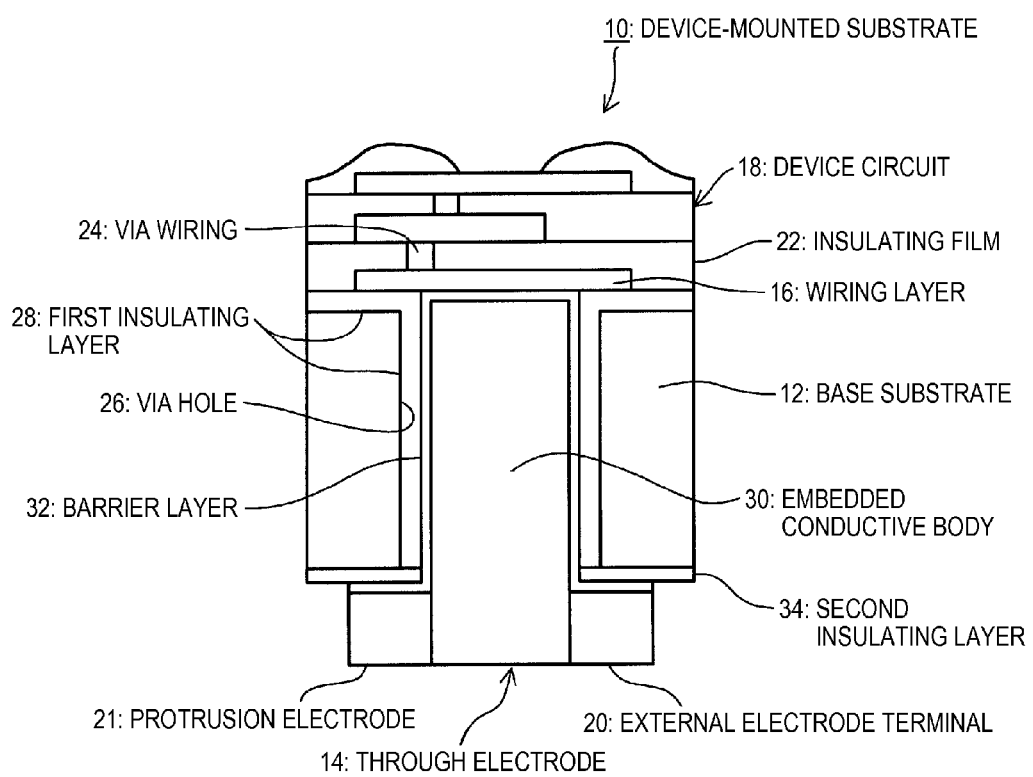
FIG. 1 is a cross-sectional view schematically illustrating a main part of a device-mounted substrate according to an embodiment of the invention.

FIG. 1 is a cross-sectional view illustrating a device-mounted substrate 10 according to an embodiment. As shown in the figure, the device-mounted substrate 10 is provided with a through electrode 14 which is formed through a base substrate 12 in a thickness direction. A device circuit 18 which is connected to the through electrode 14 through a wiring layer 16 is disposed on a front surface side of the base substrate 12 which is an end side of the through electrode 14. On the other hand, the other end side of the through electrode 14 protrudes from a rear surface of the base substrate 12. An external electrode terminal 20 is formed thereon, to form a protrusion electrode 21. Thus, it is possible to manufacture one package having a small occupation area by vertically stacking the device-mounted substrate 10 on a different chip.

More specifically, the configuration is as follows. Firstly, as the base substrate 12 in the present embodiment, a silicon (Si) semiconductor substrate is used. The through electrode 14 is provided from the rear surface of the Si substrate 12 to the wiring layer 16 which is formed on the front surface of the Si base substrate 12. The device circuit 18 is formed on the front surface of the Si base substrate 12. Thus, the through electrode 14 electrically connects the wiring layer 16 to the external electrode terminal 20 which is formed on the rear surface of the Si base substrate 12. Further, the device circuit 18 is formed above the wiring layer 16 through an insulating film 22. The wiring layer 16 is electrically connected to the device circuit 18 by a via wiring 24 which is formed in the insulating film 22 which is disposed therebetween. The wiring layer 16 may be formed by layering a plurality of metal layers.

An inner wall of the via hole (base substrate through hole) 26 which is formed in the Si base substrate 12 is covered by a first insulating layer 28 of an inorganic material such as $SiO_2$. The first insulating layer 28 is formed by thermal oxidation under a temperature environment at about 1000° C. The first insulating layer 28 is interposed between the Si base substrate 12 and the device circuit 18 (specifically, the wiring layer 16) and is continuously formed on the inner wall surface of the via hole 26. Since the first insulating layer 28 is formed by thermal oxidation of the Si base substrate 12, the first insulating layer 28 has a fine layer property and a uniform thickness and is integrally formed on the surface of the Si base substrate 12 on which the device circuit 18 is formed and the inner wall surface of the via hole 26. The thickness of the first insulating layer 28 is about 5 to 10% of the diameter of the via hole 26. Thus, if the diameter of the via hole is about 20 μm, the first insulating layer 28 is formed to have a thickness of about 1 to 2 μm. Thus, since a corner portion of the via hole 26 on the side of the wiring layer 16 is covered by the first insulating layer 28 which has the fine property and is thick, insulation characteristics in the corner portion where insulation breakdown easily occurs are enhanced. As a result, the effect of suppressing a leakage current is enhanced.

Further, on the wiring layer 16 of the device circuit 18 which faces an opening of the via hole 26 and on the inner wall of the first insulating layer 28, a metal film (hereinafter, referred to as a barrier layer 32) such as TiW is formed. The barrier layer 32 functions as a barrier layer and an adhesion layer which prevent an embedded conductive body 30, which is formed in the inner periphery of the wiring layer 16 and the first insulating layer 28, from being diffused to the Si base substrate 12.

The conductive body 30 made of Cu, Ni, Au or the like is embedded in an inner wall of the barrier layer 32. The embedded conductive body 30 may entirely fill in a hole space surrounded by the barrier layer 32. Further, the embedded conductive body 30 may cover an inner wall of the hole space in a film form. In this case, it is preferable to embed a third insulating substance such as resin in a hole part inside the conductive film of the conductive body 30 for reinforcement.

Further, a second insulating layer 34 is formed on the rear surface of the Si base substrate 12 in order to insulate a via corner portion on the rear surface side. The rear surface of the Si base substrate 12 is opposite to the surface on which the device circuit 18 is formed. The second insulating layer 34 is formed of an inorganic material such as resin, $SiO_2$ or SiN and is formed to be connected and continuous to the first insulating layer 28. Further, at an outer surface section of the second insulating layer 34, the embedded conductive body 30 protrudes from the rear surface side of the Si base substrate 12. The external electrode terminal 20, which is connected to the protruding section, is formed. It is referred to as the protrusion electrode 21.

Thus, the via corner portion on the rear surface side is reliably covered by the first insulating layer 28 and the second insulating layer 34 in the similar way to the via corner portion on the front surface side. The insulation characteristics in the corner portion where insulation breakdown easily occurs are improved. The effect of suppressing a leakage current is enhanced.

In the present embodiment, as shown in FIG. 1, an example in which the through electrode 14 is a straight through electrode is used. But a through electrode of a taper shape may be used in which the via hole 26 is formed as a taper shape.

Manufacturing Process of Device-Mounted Substrate

Figure 2:
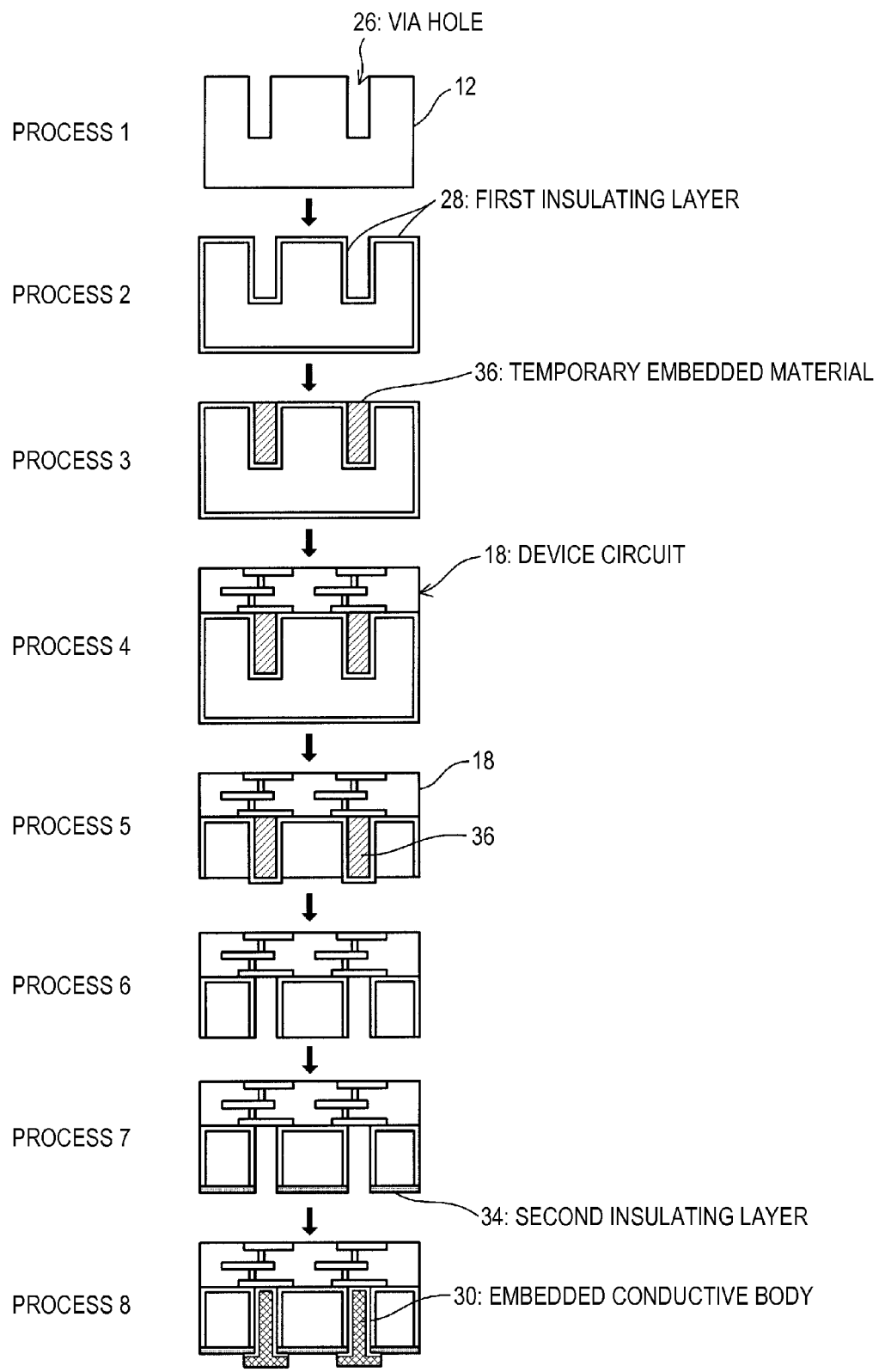
FIG. 2 is a flowchart illustrating a basic process of a through electrode forming method in a device-mounted substrate according to an embodiment of the invention.

FIG. 2 shows a basic process for manufacturing the above-described device-mounted substrate 10. Before forming the device circuit 18, the via hole 26 is formed in the Si base substrate 12 (process 1). Then, the first insulating layer 28 is formed by thermally oxidizing the Si base substrate 12 (process 2). At this time, the embedded conductive body 30 is not formed in the via hole 26. Thereafter, the device circuit 18 is formed on the opening side of the via hole 26 (process 4). However, if the device circuit 18 is formed by several layers while the via hole 26 is hollow, an atmospheric gas is filled in the closed cavity of the via hole 26. There is a possibility that an adhesive force of the device circuit 18 to the Si base substrate 12 decreases. Thus, a temporary embedded material 36 is filled in the via hole 26 in advance (process 3), i.e. before the device circuit 18 is formed. After forming the device circuit 18, the rear surface side of the Si base substrate 12 opposite to the surface on which the device circuit 18 is formed is ground to be thinned (process 5). Then, the temporary embedded material 36 in the via hole 26 is removed to open the rear surface side of the Si base substrate 12 (process 6). Then, the second insulating layer 34 is formed on the rear surface of the Si base substrate 12 (process 7). Finally, the conductive material (conductive body 30) is embedded in the via hole 26 that is already manufactured (process 8). That is, before forming the device circuit 18, the via hole 26 and the first insulating layer 28 are formed. Then, the conductive body 30 is embedded in the via hole 26 after the device circuit 18 is formed.

In this way, by forming the first insulating layer 28 in the via hole 26 by thermal oxidation before the device circuit 18 is formed, it is possible to uniformly form the first insulating layer 28 which has the very fine property and superior insulation characteristics. It is difficult to realize that such the first insulating layer 28 is formed in the related art. After the device circuit 18 is formed, it is possible to embed a conductive material such as Cu by plating as the embedded conductive body 30 without causing a migration problem. In the embedding process of the conductive body 30, the rear surface of the Si base substrate 12 opposite to the front surface on which the device circuit 18 is formed is made thin, i.e. ground, and the embedding can be performed from the rear surface. In any process, it is possible to use inexpensive apparatuses without using an expensive apparatus such as a CVD apparatus. As described above, by performing the formation of the first insulating layer 28 and the embedding of the conductive body 30 in the separate processes, it is possible to form fine through electrodes of a high aspect ratio.

Configuration of Infrared Light Sensor

Figure 5:
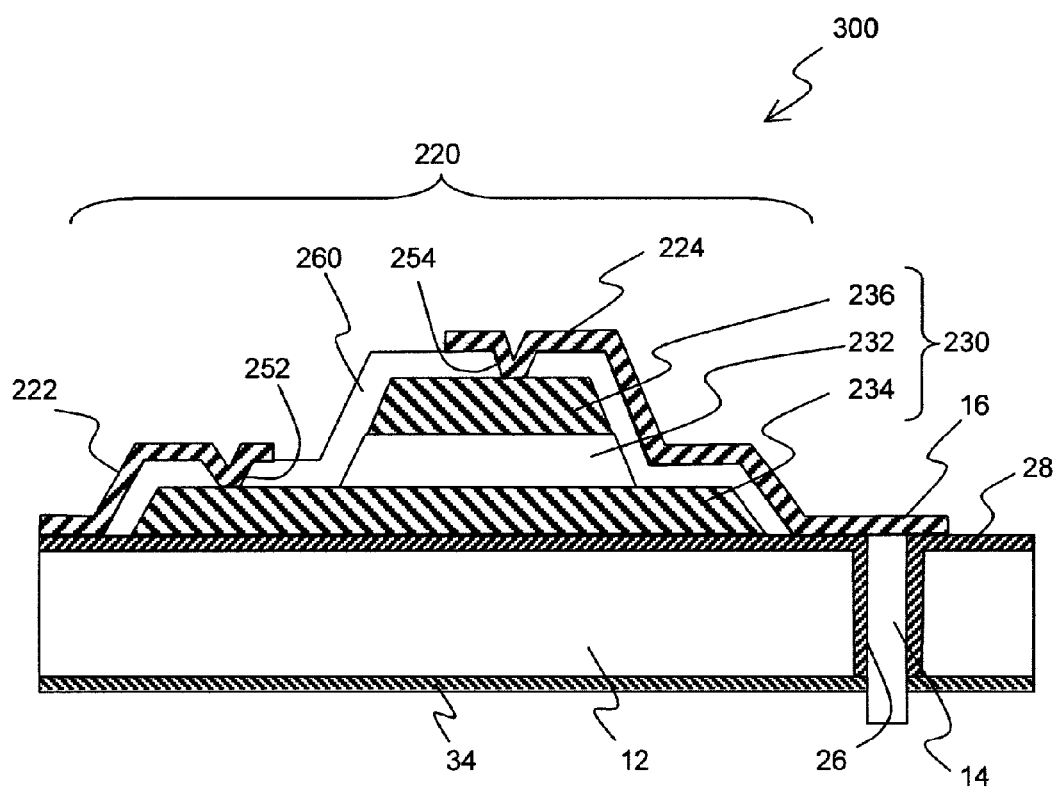
FIG. 5 is a cross-sectional view illustrating an infrared light detection device corresponding to one cell of an infrared light sensor according to an embodiment of the invention.

FIG. 5 is a cross-sectional view illustrating an infrared light detection device which forms an infrared light sensor according to an embodiment of the invention. An infrared light sensor 300 includes a plurality of arrayed sensor cells which includes an infrared light detection device 220. A detailed configuration of the infrared light sensor 300 will be described later.

As shown in FIG. 5, the infrared light sensor 300 includes the infrared light detection device 220, and the Si base substrate 12 on which the infrared light detection device 220 is mounted. The via hole 26 is formed on the Si base substrate 12. The first insulating layer 28 is formed by thermal oxidation on one surface of the base substrate 12 and the internal surface of the via hole 26. Further, the second insulating layer 34 is formed on the other surface of the Si base substrate 12. Further, the through electrode 14 is configured with a conductive body which is formed in the via hole 26.

The infrared light detection device 220 is mounted on one side of the Si base substrate 12 through the first insulating layer 28 including a thermal oxidization layer. The infrared light detection device 220 includes a capacitor 230. The capacitor 230 includes a pyroelectric material 232, a first electrode (lower electrode) 234 which is connected to a lower surface of the pyroelectric material 232, and a second electrode (upper electrode) 236 which is connected to an upper surface of the pyroelectric material 232. The amount of polarization of the pyroelectric material 232 is changed according to temperature.

An interlayer insulating film 260 is formed on the front surface of the capacitor 230. A first contact hole 252 which is for the first electrode 234 and a second contact hole 254 which is for the second electrode 236 are formed at the interlayer insulating film 260.

First and a second electrode wiring layers 222 and 224 are formed on the front surface of the interlayer insulating film 260. The first electrode wiring layer 222 is connected to the first electrode 234 through the first contact hole 252. Similarly, the second electrode wiring layer 224 is connected to the second electrode 236 through the second contact hole 254.

The through electrode 14 is connected to one of the first and second electrode wiring layers 222 and 224. In FIG. 5, the through electrode 14 is connected to the second electrode wiring layer 224. The through electrode 14 is connected to a row selection circuit (row driver) (which will be described later) or to a reading circuit which reads data from a detector through column lines, on the other surface of the Si base substrate 12.

Figure 6A:
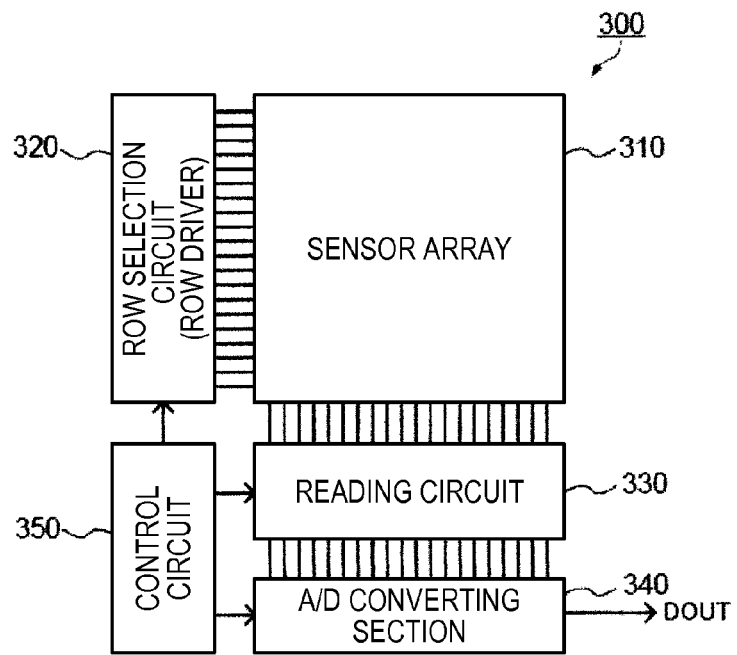
FIGS. 6A and 6B are diagrams illustrating an example of a configuration of an infrared light sensor in which an infrared light detection device is two-dimensionally arranged.
Figure 6B:
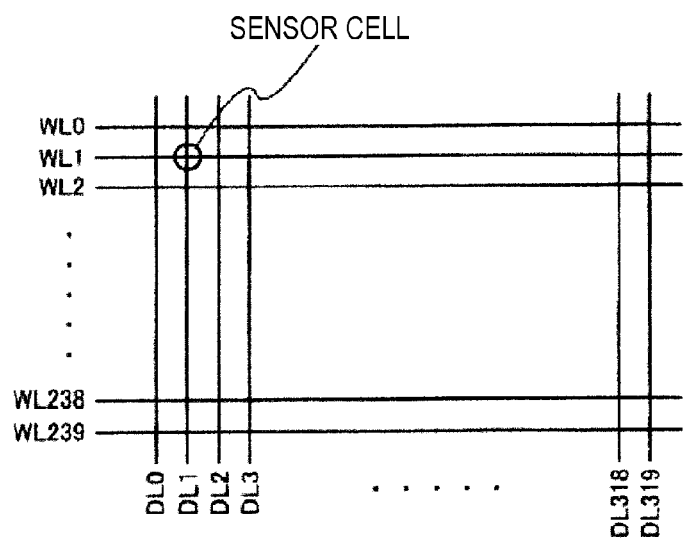

FIGS. 6A and 6B are diagrams illustrating a configuration of an infrared light sensor according to an embodiment of the invention. As shown in FIG. 6A, the infrared light sensor 300 includes a sensor array 310, a row selection circuit (row driver) 320, and a reading circuit 330. Further, the infrared light sensor 300 may include an A/D converting section 340 and a control circuit 350. By using this sensor, it is possible to realize an infrared light camera which is used for, for example, a night-vision device.

A plurality of sensor cells is arrayed (arranged) in the sensor array 310 in biaxial directions. Further, a plurality of row lines (word lines, scanning lines) and a plurality of column lines (data lines) are formed in the sensor array 310. The number of either of the row lines or the column lines may be one. For example, in a case where the number of the row lines is one, the plurality of sensor cells is arrayed in a direction (transverse direction) along the row line as shown in FIG. 6A. On the other hand, in a case where the number of the column lines is one, the plurality of sensor cells is arrayed in a direction (longitudinal direction) along the column line.

As shown in FIG. 6B, each sensor cell of the sensor array 310 is arranged (formed) in a place corresponding to an intersection of each row line and each column line. For example, the sensor cell in FIG. 6B is arranged in a place corresponding to an intersection of a row line WL1 and a column line DL1. This is similarly applied to other sensor cells. The row selection circuit 320 is connected with one or plural row lines. Then, the row selection circuit 320 performs a selection operation of each row line. For example, in a sensor array 310 (focal plane array) of a QVGA (320×240 pixels) as shown in FIG. 6B, an operation of sequentially selecting (scanning) row lines WL0, WL1, WL2, . . . , WL239 is performed. That is, a signal (word selection signal) of selecting these row lines is output to the sensor array 310.

The reading circuit 330 is connected to one or plural column lines. Then, the reading circuit 330 performs a reading operation of each column line. For example, in the sensor array 310 of the QVGA in FIG. 6B, an operation of reading detection signals (detected currents, detected charges) from column lines DL0, DL1, DL2, . . . , DL319 is performed.

The A/D converting section 340 performs an operation of A/D converting detected voltage (measured voltage, reached voltage) obtained in the reading circuit 330 into digital data. Then, digital data DOUT after the A/D conversion is output. Specifically, each A/D converter is formed corresponding to each column line of the plurality of column lines in the A/D converting section 340. Further, each A/D converter performs A/D conversion of the detected voltage obtained by the reading circuit 330 in the corresponding column line. One A/D converter may be formed corresponding to the plurality of column lines. Then, the detected voltage of the plurality of column lines may be A/D converted in a time division manner using one A/D converter in this case.

The control circuit 350 (timing generation circuit) generates a variety of control signals and outputs them to the row selection circuit 320, the reading circuit 330 and the A/D converting section 340. For example, the control circuit 350 generates control signals of charging or discharging (reset) and outputs them. Alternatively, the control circuit 350 generates signals for controlling a timing of each circuit and output them.

According to the infrared light sensor according to the embodiment of the invention, by forming the first insulating layer 28 on one surface of the Si base substrate 12 and the internal surface of the via hole 26 by thermal oxidation, it is possible to uniformly form the film which has the very fine property and superior insulation characteristics. Further, since it is possible to form fine through electrodes of a high aspect ratio, it is possible to form infrared light detection devices with high density. Accordingly, it is possible to realize an infrared light camera with high resolution.

First Embodiment

Figure 3:
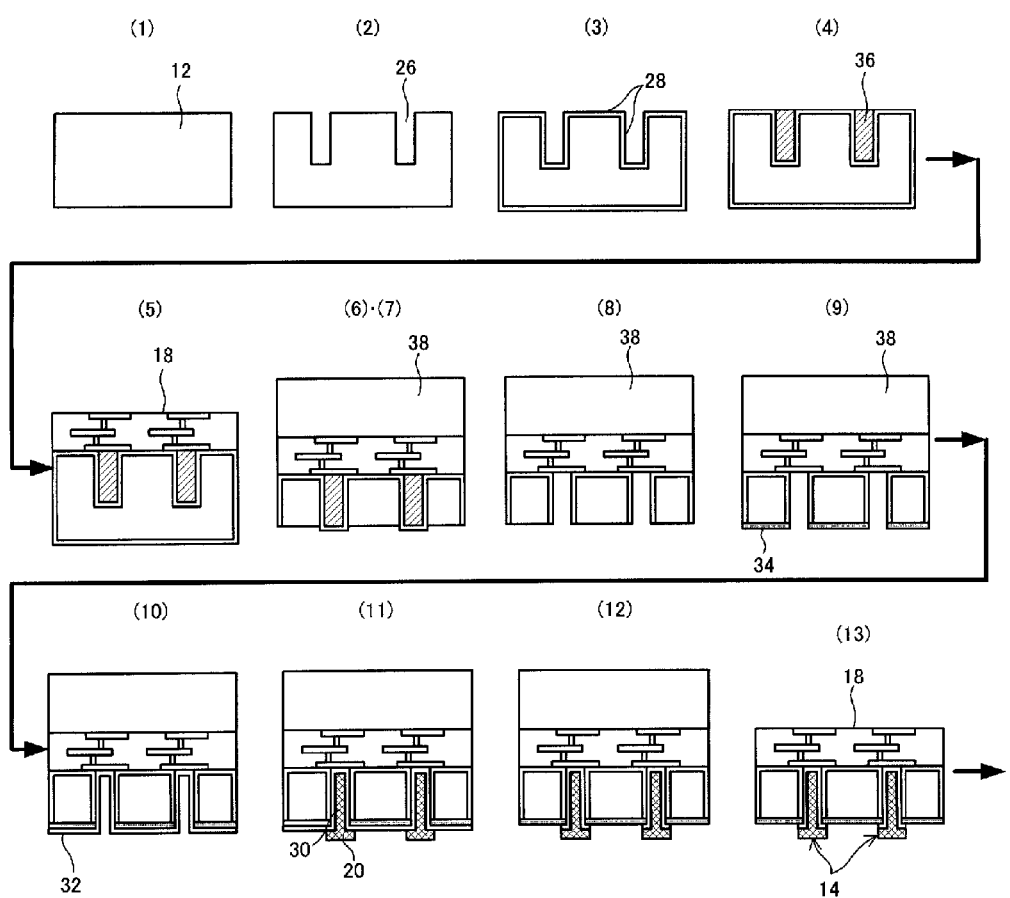
FIG. 3 is a flowchart illustrating a process of a through electrode forming method in a device-mounted substrate according to a first embodiment.

FIG. 3 is a diagram illustrating a process of a first embodiment of a through electrode forming method of a device-mounted substrate according to the invention.

Process 1: Preparation of Base Substrate

An Si semiconductor substrate is used as the base substrate 12, in this embodiment.

Process 2: Formation of Via Hole (Si etching)

The Si base substrate 12 is etched from the front surface side toward the rear surface side, to form the via hole 26 which reaches an arbitrary position of the Si base substrate 12. To this end, there are a dry etching method of RIE, or ICP and a forming method using a laser.

For example, in the dry etching method, it is possible to use the Bosch process of alternately repeating etching and deposition for digging. As gas in this case, $SF_6$ and $O_2$ are used in the etching, and $C_4F_8$ and $O_2$ are used in the deposition. To this end, it is coated by resist for protection except a portion where an opening is to be formed. Then, after the dry etching is performed, such the coated film of the resist is removed.

In the present embodiment, the via hole 26 is formed in a straight shape with a diameter of $\phi 10$ μm to 20 μm so as to be fine, to have a high aspect ratio and to form multiple via holes. The depth of the via hole is set to 70 to 100 μm. The aspect ratio of 5 to 7 is obtained. The array of the via hole 26 may be an array form (matrix) or may be a peripheral array. The pitch is 15 to 30 μm. In the case of an area array, 70,000 to 330,000 via holes per chip are obtained.

Process 3: Insulation in Via Hole and on Surface of Substrate

The side wall of the via hole 26 and the entire surface of the Si base substrate 12 are coated by the first insulating layer 28. It is possible to form an inorganic film such as $SiO_2$ and SiN through the CVD method. But the $SiO_2$ film is formed by thermal oxidation because the processing is easy and the apparatus therefor is cheap in cost by using the advantage, i.e. the device circuit 18 is not yet formed. By heating the Si base substrate 12 at 1000° C. or more for several hours, the first insulating layer 28 having a thickness of about 0.5 μm to about 3 μm is obtained. Since the first insulating layer 28 formed by thermal oxidation has the very fine layer property compared with a film formed by the CVD method, the insulation characteristics are very superior.

Process 4: Temporary Embedding of Embedded Material (Sacrificial Layer)

A temporary embedded material 36 is embedded in the via hole 26 in which the side wall is insulated. If the via hole 26 remains hollow, air in the hollow hole may be expanded by a thermal process in a device circuit forming process. As a result, adhesion of the device circuit 18 to the base substrate 12 may be reduced. A material having a low thermal diffusion and a good chemistry with the insulating film is selected as the temporary embedded material. Here, poly silicon is used. The poly silicon has a good embedding characteristic into the via hole.

Process 5: Device Circuit Formation

The device circuit 18 is formed on the front surface side of the Si base substrate 12 in which the via hole 26 is formed. The device may be an integrated circuit or a sensor circuit. Here, an infrared light detection device is formed. The infrared light detection device includes a pyroelectric material, and an upper electrode which is connected to the upper surface of the pyroelectric material and an lower electrode which is connected to the lower surface of the pyroelectric material. In the manufacturing process of the infrared light detection device, heating at 700° C. or higher is necessary. In a case where the embedded conductive layer 30 is embedded in the via hole before the device circuit 18 is formed in the via-first method, it is necessary to minimally diffuse the conductive material in the embedded conductive layer 30 by heat of 700° C. or higher and to prevent contamination of the infrared light detection device. Further, in general, a high melting point material such as tungsten is used for the embedded conductive layer 30, but as the shape of the Si via hole in the above process 2, it is very difficult to perform the embedding of tungsten by the CVD method. Although if it is possible, a dedicated device should be used. Thus, it is difficult to avoid a cost increase.

Process 6: Attachment of Supporting Substrate

A glass support wafer 38 is attached to the surface of the Si base substrate 12 on which the device circuit 18 is formed through an adhesive agent. The glass support wafer 38 reinforces the Si base substrate 12 which is processed to be thin, to thereby prevent crack in the process flow after the thinning process and to secure manufacturing efficiency. Since there is a possibility that the glass support wafer 38 is heated in the subsequent process, it is preferable that a linear expansion coefficient thereof be close to that of the Si base substrate 12. For example, heat-resistant glass, quartz glass may be used for the glass support wafer 38.

Process 7: Thinning of Wafer

The rear surface of the Si base substrate 12 which is the opposite surface to the surface on which the device circuit 18 is formed is made thin up to the thickness of about 50 μm to about 100 μm, for example, by back grinding. With respect to the surface which has been treated by the back grinding, an Si fractured layer which is formed by the back grinding may be removed by a method such as dry etching, spin etching or polishing. Here, the thinning process is performed until the rear surface of the Si base substrate 12 reaches to an internal surface of the via hole 26 as shown in FIG. 3.

Process 8: Removal of Embedded Material (Sacrificial Layer)

The temporary embedded material 36 which fills in the via hole 26 in the above process 4 and which protrudes from the surface (rear surface of the Si base substrate 12) opposite to the surface on which the device circuit 18 is formed is removed. This removal may be chemically or physically performed. By removing the sacrificial layer (the temporary embedded material 36), the wiring layer 16 which is a conductive section of the device circuit 18 is exposed on a bottom part of the via hole 26.

Process 9: Formation of Second Insulation Layer

The second insulating layer 34 is formed on the thinned surface (rear surface of the Si base substrate 12) opposite to the surface on which the device circuit 18 is formed. The second insulating layer 34 may be formed of an inorganic film such as $SiO_2$ or SiN through the CVD method, or may be formed of a resin material. Forming the film using the resin material is performed by a spin coating method, a spray coating method, a printing method. The thickness of the second insulating layer 34 is 0.3 to 3 μm in the side wall of the via hole 26, and is 3 μm or more on the rear surface of the Si base substrate 12. It is preferable that the thickness of the second insulating layer 34 on the rear surface of the Si base substrate 12 be 5 μm or more in view of reduction in parasitic capacitance. Here, $SiO_2$ is used for the second insulating layer 34 by the CVD method. Because the second insulating layer 34 is formed, there is a possibility that the insulating film is also formed on the conductive section (wiring layer 16) of the device circuit 18 on the bottom of the via hole 26. After the thinned surface of the Si base substrate 12 is protected by resist, the insulating film on the bottom of the via hole 26 is removed by the dry etching. The apparatus employs an oxidation film etcher. $C_2F_6$, $CF_4$ or $CHF_3$ is used as the process gas. Process 9 may be performed prior to process 8.

Process 10: Formation of Barrier Layer (Adhesion Layer) and Seed Layer

The barrier layer 32 is formed on the wiring layer 16 of the device circuit 18 which faces the opening of the via hole 26 and the inner wall of the first insulating layer 28. The barrier layer 32 prevents the embedded conductive body 30 that is formed at the inner surface of the barrier layer 32 from diffusing into the Si base substrate 12. It is possible to use Ti, TiW, or TiN as the barrier layer 32. Further, thereafter, a seed layer is formed for the next plating process. For example, Cu may be used as a material of the seed layer. These processes may be performed by the sputtering method and the CVD method. The thicknesses of those layers are 10 to 100 nm in the case of TiW, and 10 to 300 nm in the case of Cu.

In order to remove a natural oxidation film formed on the conductive section (wiring layer 16) of the device circuit 18, reverse sputtering may be performed before the barrier layer is formed. The throughput of the reverse sputtering corresponds to 300 nm etching on an $SiO_2$ conversion basis.

Process 11: Formation of Silicon Through Electrode, Rearrangement Wiring, and Rear Surface Terminal When the embedded conductive body 30 fills in the via hole 26, a resist layer for plating is formed on the rear surface side of the Si base substrate 12. In the resist layer, the following areas are open: a through electrode section, a rearrangement wiring formed on the rear surface of the Si base substrate 12, and a terminal section for connecting with an external device. Plating filling is performed in the through hole (via hole 26). Subsequently, plating of the external electrode terminal 20 on the rear surface of the Si base substrate 12 is performed.

An example in which the filling of the via hole 26 and the formation of the terminal of the rear surface, and the formation of the rearrangement wiring are performed in a series of plating processes is shown above. But these formations may be performed by individual processes. Here, the external electrode terminal 20 is formed on an upper part of the through electrode section. The thickness of the external electrode terminal 20 may be set to 6 µm. In this embodiment, Cu is used. But a low melting point metal such as SnAg or a noble metal such as Au may be layered as the top surface.

Process 12: Etching of Barrier Layer (Adhesion Layer) and Seed Layer

After the plating filling in the via hole 26 and the plating of the external electrode terminal 20 on the rear surface of the Si base substrate 12, a remaining plating resist is separated. The terminal is used as a mask to thereby remove an underlying metal (for example, TiW or Cu) by etching.

Process 13: Separation of Glass Support Wafer

Finally, the glass support wafer 38 which supports the Si base substrate 12 is separated.

A reliability test is performed for a structure body having a fine through electrode structure of a high aspect ratio which includes multiple via holes, which is manufactured by the above-described processes, through a temperature cycle test. As a result, errors due to separation between the conductive section of the device circuit and the through electrode or in the insulating film section are not recognized.

Second Embodiment

Figure 4:
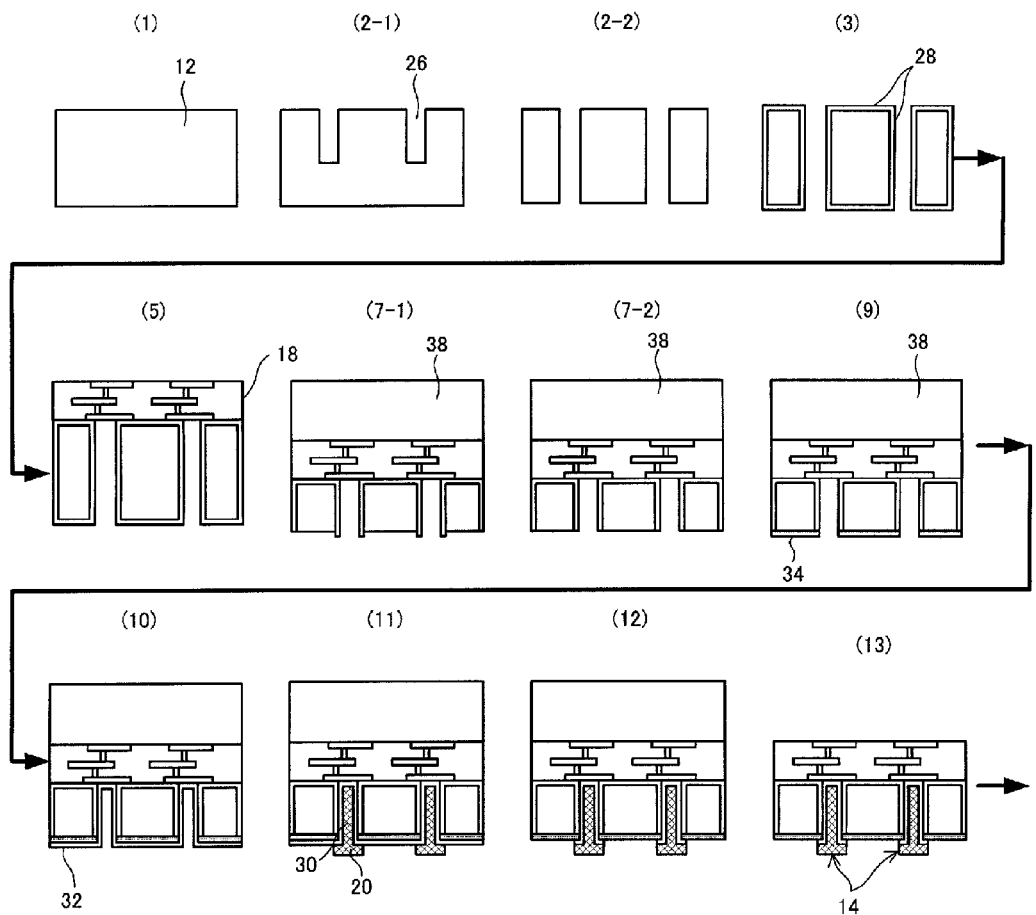
FIG. 4 is a flowchart illustrating a process of a through electrode forming method in a device-mounted substrate according to a second embodiment.

FIG. 4 is a diagram illustrating a process of a through electrode forming method in a device-mounted substrate according to a second embodiment of the invention.

The basic processes are the same as in the first embodiment, but partial processes are different. That is, after the Si etching is performed for forming the via hole of the second process in the first embodiment (process 2-1), the Si etching is also performed from the rear surface side. As a result, the through hole which penetrates the Si base substrate 12 in the thickness direction is formed (process 2-2). Then, approximately the same processes are performed. Since the through hole 26 is formed and open, it is possible to prevent the adhesive force of the device circuit 18 for the Si base substrate 12 from being reduced by the expanded air in the via hole 26 due to temperature in the device circuit forming process. Accordingly, it is possible to omit the process of filling the temporary embedded material 36 in the via hole 26 (process 4 in the first embodiment) and the removal process of the temporary embedded material 36 (process 8 in the first embodiment). In the process flow of FIG. 4, with respect to the thinning of the wafer, a substrate etching process (process 7-1) and a smoothing process of the first insulating layer 28 (process 7-2) on the rear surface side of the Si base substrate 12 are separately shown. With respect to the other processes, the process numbers (1) to (13) are given to the same processes as in the first embodiment.

A reliability test is performed for a structure body having a fine through electrode structure of a high aspect ratio which includes multiple via holes, which is manufactured by the above-described processes (second embodiment), through a temperature cycle test. As a result, errors due to separation between the conductive section of the device circuit and the through electrode or in the insulating film section are not recognized.

The invention can be applied to a manufacturing technology such as an infrared light camera or a quartz oscillator package.

What is claimed is:

1. A substrate comprising:
   a base substrate having a first surface and a second surface opposite to each other;
   a via hole formed in the base substrate, the via hole being open at the first and second surfaces, the via hole having an internal surface in the base substrate;
   a first insulating layer including a thermal oxidation layer, the thermal oxidation layer being formed on the first surface and the internal surface;
   a second insulating layer being connected with the first insulating layer, and the second insulating layer being disposed on the second surface of the base substrate;
   a device circuit being formed above the first surface of the base substrate through the first insulating layer;
   a conductive body being disposed in the via hole, the conductive body being surrounded by the first insulating layer and including a protruding section which protrudes from the second surface of the base substrate and is adjacent to the second insulating layer; and
   a wiring layer being electrically connected to the conductive body, the wiring layer being disposed above the first surface through the first insulating layer, wherein
   a first thickness of the first insulating layer disposed on the first surface and a second thickness of the first insulating layer disposed on the internal surface are the same.

2. A through electrode forming method comprising:
   forming a via hole from a first surface of a base substrate, the via hole having an internal surface in the base substrate;
   forming a thermal oxidation layer on the first surface of the base substrate and the internal surface of the via hole by thermal oxidation;

forming a device circuit which includes a conductive section above the first surface of the base substrate after the forming of the thermal oxidation layer;

forming an insulation layer on a second surface of the base substrate after the forming of the device circuit by CVD; and embedding a conductive body in the via hole, after the forming of the insulation layer.

3. The method according to claim 2, further comprising:

embedding a temporary embedded material in the via hole, between the forming of the thermal oxidation layer and the forming of the device circuit; and removing the temporary embedded material, between the forming of the device circuit and the embedding of the conductive body.

4. The method according to claim 2, further comprising:

grinding the second surface of the base substrate, the second surface being opposite to the first surface through the base substrate; and disposing an insulating layer which is continuous with the thermal oxidation layer on the second surface of the base substrate, between the forming of the device circuit and the embedding of the conductive body.

5. The method according to claim 4, further comprising:

forming a terminal which is electrically connected with the conductive body on the second surface of the base substrate, after the embedding of the conductive body.

6. The method according to claim 5, further comprising:

attaching a supporting member to the first surface of the base substrate, before grinding the second surface of the base substrate.

7. The method according to claim 6, further comprising:

removing the supporting member attached to the first surface of the base substrate, after forming the terminal.

8. The method according to claim 2, wherein the via hole is formed through the base substrate as a through hole.

9. The method according to claim 2, wherein the conductive body is formed by plating.

10. An infrared light sensor comprising:

a base substrate having a first surface and a second surface opposite to each other;

a via hole formed in the base substrate, the via hole being open at the first and second surfaces, the via hole having an internal surface in the base substrate;

a first insulating layer including a thermal oxidation layer, the thermal oxidation layer being formed on the first surface and the internal surface;

a second insulating layer being connected with the first insulating layer, and the second insulating layer being disposed on the second surface of the base substrate;

a conductive body being disposed in the via hole, the conductive body being surrounded by the first insulating layer and including a protruding section which protrudes from the second surface of the base substrate and is adjacent to the second insulating layer;

a wiring layer being electrically connected to the conductive body, the wiring layer being disposed above the first surface through the first insulating layer; and an infrared light detection device being electrically connected to the wiring layer, wherein a first thickness of the first insulating layer disposed on the first surface and a second thickness of the first insulating layer disposed on the internal surface are the same.

11. The substrate according to claim 1, wherein the base substrate is a silicon substrate, and wherein the thermal oxidation layer is a silicon oxidation layer.

12. The infrared light sensor according to claim 10, wherein the base substrate is a silicon substrate, and wherein the thermal oxidation layer is a silicon oxidation layer.

13. The substrate according to claim 1, further comprising:

a device circuit which is electrically connected with the wiring layer.

14. The infrared light sensor according to claim 10, further comprising:

a device circuit which is electrically connected with the wiring layer.

15. A substrate comprising:

a base substrate having a first surface and a second surface opposite to each other;

a conductive body being disposed in the base substrate, the conductive body having a first end located at the first surface and a second end located at the second surface, the conductive body electrically connecting the first end with the second end, and the conductive body having a protruding section which protrudes from the second surface of the base substrate;

a thermal oxidation layer being formed on the first surface of the base substrate and being formed between the base substrate and the conductive body;

a device circuit being formed above the first surface of the base substrate through the thermal oxidation layer;

an insulating layer being connected with the thermal oxidation layer, and the insulating layer being disposed on the second surface of the base substrate and adjacent to the protruding section; and a wiring layer being electrically connected to the conductive body, the wiring layer being disposed above the first surface through the thermal oxidation layer, wherein a first thickness of the thermal oxidation layer disposed on the first surface and a second thickness of the thermal oxidation layer disposed between the base substrate and the conductive body are the same.

16. The substrate according to claim 15, wherein the base substrate is a silicon substrate, and wherein the thermal oxidation layer is a silicon oxidation layer.

17. An infrared light sensor comprising:

a base substrate having a first surface and a second surface opposite to each other;

a conductive body being disposed in the base substrate, the conductive body having a first end located at the first surface and a second end located at the second surface, the conductive body electrically connects the first end with the second end, and the conductive body having a protruding section which protrudes from the second surface of the base substrate;

a thermal oxidation layer being formed on the first surface of the base substrate and being formed between the base substrate and the conductive body;

an insulating layer being connected with the thermal oxidation layer, and the insulating layer being disposed on the second surface of the base substrate and adjacent to the protruding section;

a wiring layer being electrically connected to the conductive body, the wiring layer being disposed above the first surface through the thermal oxidation layer; and an infrared light detection device being electrically connected to the wiring layer, wherein a first thickness of the thermal oxidation layer disposed on the first surface and a second thickness of the thermal oxidation layer disposed between the base substrate and the conductive body are the same.

18. The infrared light sensor according to claim 17, wherein the base substrate is a silicon substrate, and wherein the thermal oxidation layer is a silicon oxidation layer.

19. A base substrate comprising:
a base substrate having a first surface and a second surface opposite to each other;
a conductive body that is disposed so as to penetrate the base substrate;
a first insulating layer that is disposed between the conductive body and the base substrate, and that is disposed so as to cover the first surface; and
a wiring that is a separate component from the conductive body, and electrically connected to the conductive body, the wiring covering the conductive body and a part of the first insulating layer,
the conductive body protruding from the second surface,
wherein the first insulating layer is disposed on the first surface, and a first thickness of the first insulating layer disposed on the first surface and a second thickness of the first insulating layer disposed between the base substrate and the conductive body are the same.

20. The substrate according to claim 19, further comprising:
a second insulating layer that is disposed so as to cover the second surface;
the conductive body protruding from the second insulating layer.

* * * * *